United States Patent [19]
Lane et al.

[11] 4,361,878
[45] Nov. 30, 1982

[54] DEGRADABLE LRU CIRCUIT

[75] Inventors: Thomas A. Lane, New Brighton; David M. Webb, Blaine, both of Minn.

[73] Assignee: Control Data Corporation, Minneapolis, Minn.

[21] Appl. No.: 200,876

[22] Filed: Oct. 27, 1980

[51] Int. Cl.³ .............................................. G06F 1/00
[52] U.S. Cl. ................................................. 364/900
[58] Field of Search ... 364/200 MS File, 900 MS File

[56] References Cited
U.S. PATENT DOCUMENTS 3,737,881  6/1973  Cordi et al. .......................... 364/900
4,121,286 10/1978  Venton et al. ........................ 364/900

OTHER PUBLICATIONS

Paging Apparatus for Data Storage Hierarchy System, East, IBM TDB vol. 18, No. 2, Jul., 1975, pp. 502-503.

Primary Examiner—Harvey E. Springborn
Attorney, Agent, or Firm—Edward L. Schwarz; Joseph A. Genovese

[57]  ABSTRACT

A modified least recently used resolving network provides the capability of ignoring any one or more of the signals indicating use of the device in resolving the least recently used status of the devices.

2 Claims, 1 Drawing Figure

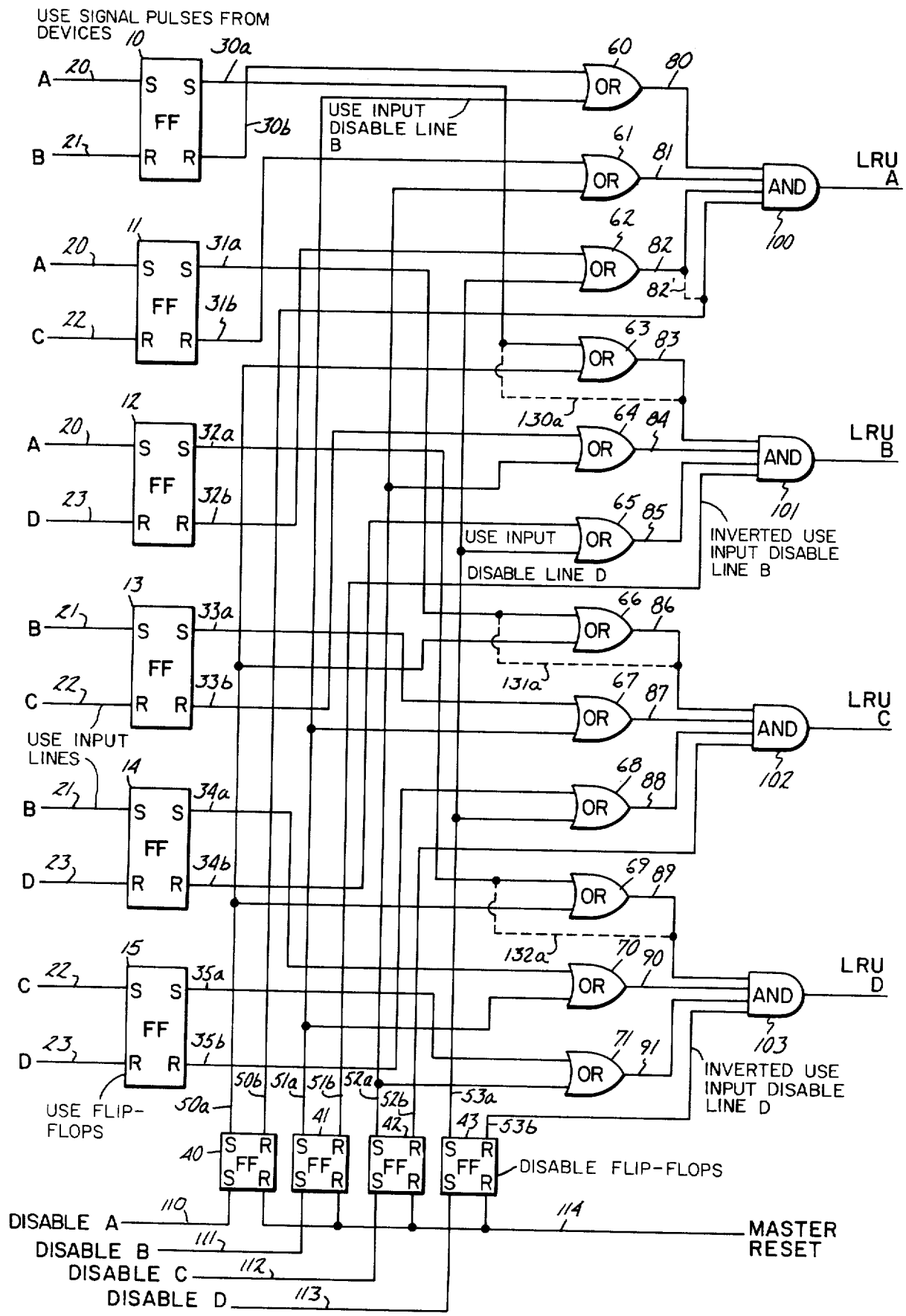

DEGRADABLE LRU CIRCUIT

BACKGROUND OF THE INVENTION

In certain types of computing systems, it is useful to know which of several, usually similar, component devices in the system has gone the longest without being used. For example, if the component devices are main memories, cache memories, or memory areas storing pages in a virtual memory computer system, when a new page not in one of the memories is requested, it is common practice to use the memory or memory area which has gone the longest without reference as the repository for the new page. This has become known as the least recently used (LRU) algorithm. Because time is quite important in resolving LRU status, dedicated hardware is frequently employed for this purpose. Typical hardware of this type is shown in *Computer Storage Systems and Technology*, p. 596, Richard Matick, 1977, John Wiley & Sons.

With certain types of new memories, a trade-off of high speed and low cost is made versus reliability. In such a situation, if one memory fails and is not used, the other devices can be used with greater frequency and somewhat lower overall speed until the faulty device can be replaced or repaired. Such a faulty memory should not be considered in resolving the LRU algorithm, even though it will in fact, through its deliberate non-use, become the LRU device shortly after it becomes faulty. Accordingly, it is necessary to modify or disable the conventional LRU resolving network to ignore the not-to-be-used device.

BRIEF DESCRIPTION OF THE INVENTION

To allow not-to-be-used devices to be ignored by the LRU resolving network a modification is possible to the network. This modification employs additional OR gates interposed between the Matick book's flip-flops receiving the signals indicative of the use of each device, and the AND gates receiving the output of these flip-flops.

BRIEF DESCRIPTION OF THE DRAWING

The FIGURE discloses a 4 device LRU network including the modification permitting any one or more of the devices to be ignored in resolving the LRU status.

DESCRIPTION OF THE PREFERRED EMBODIMENT

The FIGURE discloses a logic diagram in which 4 devices, conveniently referred to as devices A, B, C, and D each generate a use signal pulse having a logical level of 1 each time the device is used. Only one device is in use and only one pulse generated at any given time. Devices A-D are assigned respectively to use input lines 20-23, each of which carries the use signal pulses from its assigned device. Use input lines 20-23 are connected in unique combinatorial pairs to the set (S) and reset (R) inputs of use flip-flops 10-15. Use flip-flops 10-15 are of the conventional type which have set and reset outputs respectively associated with the set and reset inputs. They produce a logical 1 signal responsive to a logical 1 pulse or signal at the associated input and maintain the logical 1 level until a logical 1 signal is reapplied to the not associated input of the flip-flop. The outputs of each use flip-flop 10-15 are always logically inverted with respect to each other, i.e., the output whose associated input has not last received a logical 1 signal level, produces a logical 0 output. For purposes of this invention, the set and reset input terminals are wholly arbitrary designations to distinguish between each one of the pair of flip-flop inputs.

The known prior art technique as well as our modification to it is totally general as far as the number of devices to be included for LRU resolution. In fact, the number of use flip-flops required for a particular network is simply the combination of the number of devices whose use history is to be resolved, taken two at a time. Thus for 4 devices, the 6 use flip-flops 10-15 are required.

Use flip-flops 10-15 record the time relative usage history as between each pair of use input lines 20-23. A use signal pulse on any one of the use input lines 20-23 indicates use of the device assigned to that use input line and causes that side of each use flip-flop 10-15 connected to the line 20-23 involved, to be set. Thus, a pulse on use input line 20 causes use flip-flops 10, 11, and 12 to have their set or S outputs 30a, 31a and 32a to be set, that is, to produce a logical 1 signal indicating that devices B, C, and D all have earlier latest uses than device A. If at some later time, a use signal pulse is placed on use input line 23, which indicates use of device D, then use flip-flop 12 will change so that it is reset, or R output line 32b will be set to a logical 1, indicating that device A now has an earlier latest use than device D. Of course, flip-flops 14 and 15 may well be altered as well.

OR gates 60-71 form a portion of this improvement to the standard LRU network. Their purpose is to provide a means of eliminating consideration of each device for which a use input disable line 50a, 51a, 52a, or 53a exists and carries a disable signal. The disable signal when present simulates the condition that its associated use input line 20, 21, 22 or 23 has carried a use signal pulse more recently than any use input line not associated with an input disable line carrying a disable signal.

AND gates 100-103 resolve the use history recorded by flip-flops 10-15 among those use input lines not associated with a disable signal. Each AND gate 100-103, when producing a logical 1, indicates that the device associated with it is in fact the device whose last use is earlier than any others, and is not disabled. To provide fo sensing this last (not disabled) condition, the logical inverse of the disable signals on lines 50a, 51a, 52a, and 53a must be applied to AND gates 100-103. Lines 50b, 51b, 52b, and 53b respectively carry the logical inversions for the respective disable signals on lines 50a, 51a, 52a, and 53a. When the logical inverse of the disable signal is applied to one input of any of AND gates 100-103, that AND gate senses the signal and produces a logical 0 output thereby allowing only those AND gates associated with undisabled devices to produce a logical 1 indicating LRU status.

Although not an essential part of the invention, flip-flops 40-43 are included in the FIGURE to form a commercial embodiment and record the disable status of each device. Each flip-flop 40-43 is identical to flip-flops 10-15. Each is associated respectively with one of the devices A through D and therefore, also of course, respectively with one use input line 20-23. Typically, once a device is disabled it will be disabled for a relatively long period of time, and when one device is again activated, typically all devices will undergo the same maintenance or replacement procedures. Accordingly, the set terminals of flip-flops 40–43 are individually activated by signal paths 110–113 respectively which indicate inactivation of the associated device with a short pulse sufficient to set the associated flip-flop 40–43. Flip-flops 40–43 can be cleared en masse by master reset line 114. Conveniently, the S and R outputs for conventional flip-flops are the logical inverse of each other, so the disable signals for OR gates 60–71 and the logical inversions thereof for input to AND gates 100–103 are available.

In the FIGURE, OR gates 60–71 can be conveniently organized into 4 OR gate groups, each group associated with one use input line and the device assigned to it. For example, OR gates 60, 67 and 70 form a group associated with device B and the use input signal on line 21. The associated is on the basis that the gates in each of the groups each have one input connected to a different one of the flip-flop 10–15 outputs associated with a single one of the use input lines 20–23 to which the associated device is assigned. The effect is to set an OR gate's output to logical 1 when the device assigned to the use input line and associated with the OR gate group of which the particular OR gate is a member, has been used more recently than the other device whose use input line is connected to the flip-flop supplying the OR gate input. In addition, each OR gate in a particular group is connected at its second input to the use input disable line associated with the use input line associated with the group. The effect of setting a particular use input disable signal to 1 is to cause the output of each OR gate in its group to supply a logical 1 output, thereby simulating that the associated device has a later use than any other device. For example, OR gate 60 is associated with device B and use input line 21. Accordingly, OR gate 60 receives the disable signal on path 51a, indicating the disable status of device B and the signal from flip-flop 10 on path 30b indicating the use history of device B versus device A. Similarly, each OR gate 61–71 receives as inputs the disable signal on that one of lines 50a–53a associated with a device associated with the OR gate group of which the gate is a member, and also the flip-flop 10–15 output associated as explained earlier, with the input connected to the use input line associated with its group. The other OR gate groups in this example comprise gates 61, 64, and 71; 62, 65 and 68; and 63, 66, and 69.

The outputs on lines 80–91 of OR gates 60–71 are supplied to AND gates 100–103 according to the following rule. An AND gate receives as an input the output from each OR gate connected to both (i) a use input disable line 50a–53a not associated with that AND gate (via the AND gate association with the use input lines 20–23) and (ii) to the other of the use flip-flop 10–15 outputs associated with inputs receiving the use input signal on lines 20–23 with which the AND gate involved is associated. To exemplify this, using OR gate 60 again as an example, AND gate 100 receives an input on path 80 which is the output of the OR gate which receives (i) a disable device B signal (a use input disable line not associated with AND gate 100 or use input line 20) and (ii) the R output of flip-flop 10 (the other of use flip-flop 10's outputs associated with an input connected to the use input line with which AND gate 100 is associated, in this case the device A use input on line 20). In this fashion, the entire network shown in the FIGURE is constructed to provide LRU resolution with the option of ignoring any one or more of the devices in establishing their use history, accordingly as flip-flops 40–43 are set by signals on paths 110–113.

In certain circumstances, it may be useful to provide the option of disabling for only a certain number of the devices. It is possible to modify the network shown in the FIGURE. By removing that portion of the logic associated with the ignoring of a particular device or devices and still provide the option of ignoring those for which the logic circuitry remains. For example, if it was determined that device A was an essential or a totally reliable device which would be never ignored no matter what the situation, the FIGURE can be modified to provide this condition by removing the group of OR gates associated with device A and its use input signal line 20. Thus OR gates 63, 66, and 69 are removed and their inputs on paths 30a, 31a, and 32a are instead respectively connected by dotted line paths 130a, and 132a, directly to AND gate input paths 83, 86, and 89. Disable flip-flop 40 is also removed along with its output signal paths 50a and 50b. In particular, AND gate 100 no longer receives the not disabled signal on path 50b from flip-flop 40. This input to AND gate 100 can be instead conveniently tied to any of the other three inputs 80–82 as shown by dotted line path 82', or a three input AND gate may be used for AND gate 100. That is, where no OR gate group is present to permit any specific one of the devices A–D to be ignored, the input to the particular AND gate 100–103 in this case is the other of the use flip-flop 10–15 outputs associated with an input receiving the use input signal with which the AND gate is associated. In this manner, the network of the FIGURE may be tailored to provide the capability for ignoring any one or more of the devices.

The preceding describes the preferred embodiment of the invention. Other preferred embodiments may employ different types of logic gates and flip-flops. One should note that selection of logical 0 and logical 1 levels is purely arbitrary. Depending on the family of logic circuits selected, implementations may differ in some respects but be equivalent from a Boolean standpoint.

What is claimed is:

1. A least recently used (LRU) resolving network of the type having a plurality of use input lines, each use input line having assigned to it one existing device whose use history is to be included in the resolution and carrying a logical 1 use input signal pulse generated responsive to each use of the assigned device, and having at least one use input disable line, each such use input disable line associated with one use input line, and each use input disable line when carrying a logical 1 signal indicating to the network that the associated use input line and the device assigned to it are to be ignored in resolving the LRU status of the devices, comprising:

(a) a plurality of use flip-flops for recording the relative use history of all said devices, each use flip-flop having set and reset inputs, and set and reset outputs producing signals logically inverted with respect to each other and each output respectively associated with its flip-flop's similarly named set and reset inputs, each of said outputs producing a logical 1 signal responsive to a logical 1 use input signal pulse received at its associated input, and the inputs of each use flip-flop connected to the use input lines assigned to a unique combinatorial pair of devices;

(b) at least one group of OR gates, each group associated with one use input line, each gate in the group connected at a first input to a different use flip-flop output associated with the flip-flop input connected to the use input line with which the gate's group is associated, and a second input to the use input disable line associated with the use input line with which the group is associated, and each OR gate producing a logical 1 signal responsive to the presence of a logical 1 signal on either input line;

(c) means for logically inverting the signal on each use input disable line; and (d) a plurality of multiple input AND gates, each AND gate associated with one use input line and indicating with a logical 1 signal output that the device assigned to the AND gate's associated use input line is the LRU device when all inputs to the AND gate are logical 1's, and each receiving as inputs (i) the output of each OR gate connected to both (A) a use input disable line not associated with the use input line with which the AND gate is associated and (B) to the inversion of each use flip-flop output associated with the use flip-flop's input connected to the use input line with which the AND gate is associated, (ii) all of the use flip-flops' outputs not otherwise connected to OR gate inputs and associated with an input connected to the use input line with which the AND gate is associated, and (iii) the output of the means inverting the signal on the use input disable line associated with the use input line with which the AND gate is also associated.

2. The apparatus of claim 1, further comprising at least one disable flip-flop similar to the use flip-flops, and assigned to a single device, each said disable flip-flop having a set output connected to the use input disable line associated with the device assigned to the disable flip-flop involved, and when receiving at the set input corresponding thereto a logical 1 signal from an external source indicating that the device is to be ignored in resolving usage history of the devices and supplying a logical 1 at the set output responsive to the logical 1 at the set input.

* * * * *